United States Patent
Henry

(10) Patent No.: US 9,413,115 B1
(45) Date of Patent: Aug. 9, 2016

(54) EMI GASKET FOR ELECTRICAL CONNECTOR ASSEMBLY

(71) Applicant: Tyco Electronics Corporation, Berwyn, PA (US)

(72) Inventor: Randall Robert Henry, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/712,342

(22) Filed: May 14, 2015

(51) Int. Cl.
*H01R 13/6581* (2011.01)
*H01R 13/74* (2006.01)
*H05K 9/00* (2006.01)

(52) U.S. Cl.
CPC .......... *H01R 13/6581* (2013.01); *H01R 13/745* (2013.01); *H05K 9/0015* (2013.01); *H05K 9/0016* (2013.01); *H05K 9/0032* (2013.01)

(58) Field of Classification Search
CPC ..................... H01R 13/65802; H01R 13/6581; H01R 13/745; H05K 9/0016; H05K 9/0015; H05K 9/0032
USPC ............................ 439/939; 361/800, 816, 818
See application file for complete search history.

(56) References Cited

U.S. PATENT DOCUMENTS

| | | | | |
|---|---|---|---|---|
| 6,359,768 B1 * | 3/2002 | Eversley | ................. | G06F 1/182 361/212 |
| 6,478,622 B1 | 11/2002 | Hwang | | |
| 7,150,653 B1 * | 12/2006 | Mason | ............. | H01R 13/65802 385/92 |
| 7,438,596 B2 * | 10/2008 | Phillips | .............. | H01R 13/6582 439/607.01 |
| 7,727,018 B2 * | 6/2010 | Bright | .............. | H01R 13/65802 439/607.28 |
| 8,251,746 B2 * | 8/2012 | Zhang | ................ | H01R 13/6581 439/607.11 |
| 8,444,437 B2 * | 5/2013 | Szczesny | ........... | H01R 13/6587 361/704 |
| 8,890,004 B2 * | 11/2014 | Wickes | .............. | H01R 13/6583 174/354 |
| 9,160,090 B2 * | 10/2015 | Su | ....... | H01R 12/7082 |
| 2009/0068885 A1 * | 3/2009 | He | ...... | G11B 33/1493 439/607.01 |
| 2010/0266246 A1 * | 10/2010 | van Haaster | ......... | G02B 6/4201 385/94 |

\* cited by examiner

*Primary Examiner* — Amy Cohen Johnson
*Assistant Examiner* — Oscar C Jimenez

(57) ABSTRACT

An EMI gasket for a cage member of an electrical connector assembly includes a base having a metal body section configured to extend along a wall of the cage member. The EMI gasket includes external spring beams extending from the base. The external spring beams are configured to be received in an opening of a bezel mounted to a front end of the cage member and configured to engage the bezel to electrically connect the EMI gasket to the bezel. The external spring beams extend from base ends at the base to distal ends opposite the base ends. The EMI gasket includes a tie bar at the distal ends connecting the distal ends of the external spring beams together. The tie bar has a flange extending outward therefrom. The flange is configured to stop loading of the bezel onto the front end of the cage member.

20 Claims, 3 Drawing Sheets

EMI GASKET FOR ELECTRICAL CONNECTOR ASSEMBLY

BACKGROUND OF THE INVENTION

The subject matter herein relates generally to an electromagnetic interference (EMI) gasket for an electrical connector.

Some known electrical connector assemblies include a metal cage having a plurality of ports that each receive a small form factor pluggable (SFP) module therein. The pluggable modules may plug into a communication connector that is held within the cage and is electrically connected to a host circuit board. A front end of the cage that includes the ports for the pluggable modules is typically held within a panel of a housing and/or a bezel covers the front end of the cage. The front end of the cage typically includes a plurality of springs to hold the cage end within the opening and/or to contain EMI emissions through the opening. However, the springs are susceptible to damage. For example, if the bezel is loaded to far rearward, such as beyond the ends of the springs, removal of the bezel will damage the springs, such as by bending the springs.

There is a need for an electrical connector assembly that includes a cage that facilitates minimizing EMI emissions while preventing damage to EMI springs at the front end of the cage.

BRIEF DESCRIPTION OF THE INVENTION

In one embodiment, an EMI gasket is provided for a cage member of an electrical connector assembly. The EMI gasket includes a base having a metal body section configured to extend along a wall of the cage member. The EMI gasket includes external spring beams extending from the base. The external spring beams are configured to be received in an opening of a bezel mounted to a front end of the cage member and configured to engage the bezel to electrically connect the EMI gasket to the bezel. The external spring beams extend from base ends at the base to distal ends opposite the base ends. The EMI gasket includes a tie bar at the distal ends connecting the distal ends of the external spring beams together. The tie bar has a flange extending outward therefrom. The flange is configured to stop loading of the bezel onto the front end of the cage member.

In another embodiment, an electrical connector assembly is provided including a cage member having a plurality of walls defining a port configured to receive a pluggable module therein through a front end of the cage member. The walls are manufactured from a metal material and providing electrical shielding for the port. An EMI gasket is mounted to the front end of the cage member. The EMI gasket includes a base coupled to at least one of the walls of the cage member that is electrically connected to the cage member. The EMI gasket has external spring beams extending from the base that are configured to be received in an opening of a bezel mounted to the front end of the cage member. The EMI gasket has a tie bar connecting distal ends of the external spring beams together. The tie bar has a flange extending outward therefrom configured to stop loading of the bezel onto the front end of the cage member.

In a further embodiment, an electrical connector assembly is provided that includes a cage member having a plurality of walls defining a port configured to receive a pluggable module that are manufactured from a metal material and providing electrical shielding for the port. The electrical connector assembly includes a communication connector disposed within the cage member at a rear end of the cage member and positioned to mate with the pluggable module when the pluggable module is inserted into the port. The electrical connector assembly includes an EMI gasket mounted to the front end of the cage member. The EMI gasket includes a base coupled to at least one of the walls of the cage member and being electrically connected to the cage member. The EMI gasket has internal spring beams extending from the base into the port of the cage member for electrical connection with the pluggable module. The EMI gasket has external spring beams extending from the base. The EMI gasket has a tie bar connecting distal ends of the external spring beams together. The tie bar has a flange extending outward therefrom. The electrical connector assembly includes a bezel mounted to the front end of the cage member. The bezel has an opening surrounding the front end of the cage member and the EMI gasket. The external spring beams engage the bezel in the opening. A rear of the bezel abuts against the flange to stop loading of the bezel onto the front end of the cage member.

DETAILED DESCRIPTION OF THE INVENTION

Figure 1:
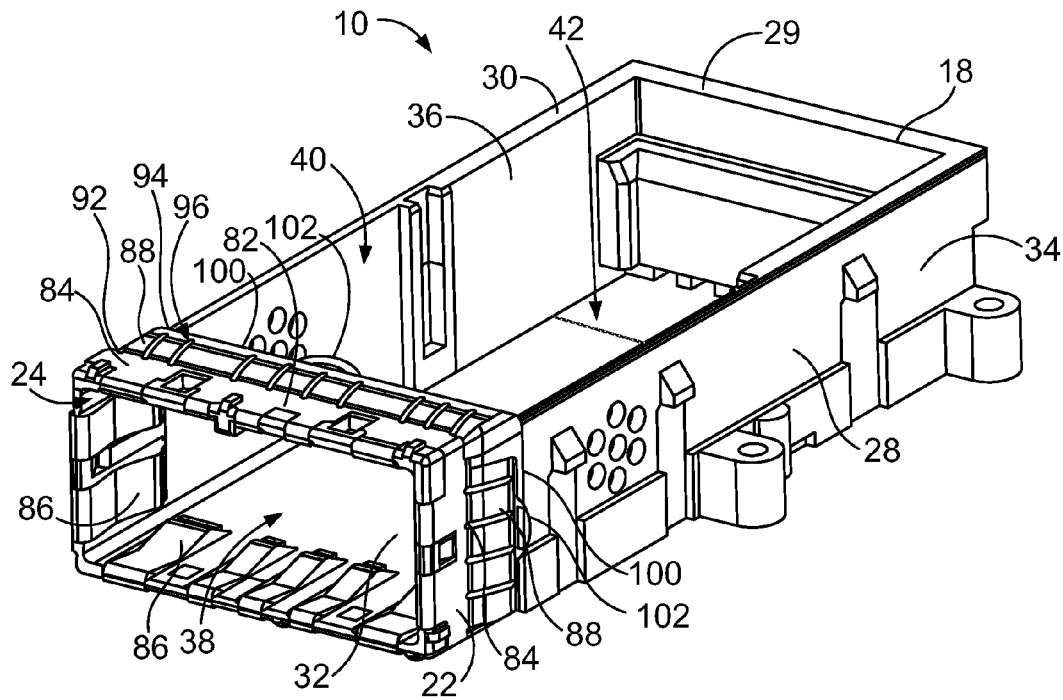
FIG. 1 is a perspective view of an exemplary embodiment of an electrical connector assembly.
Figure 2:
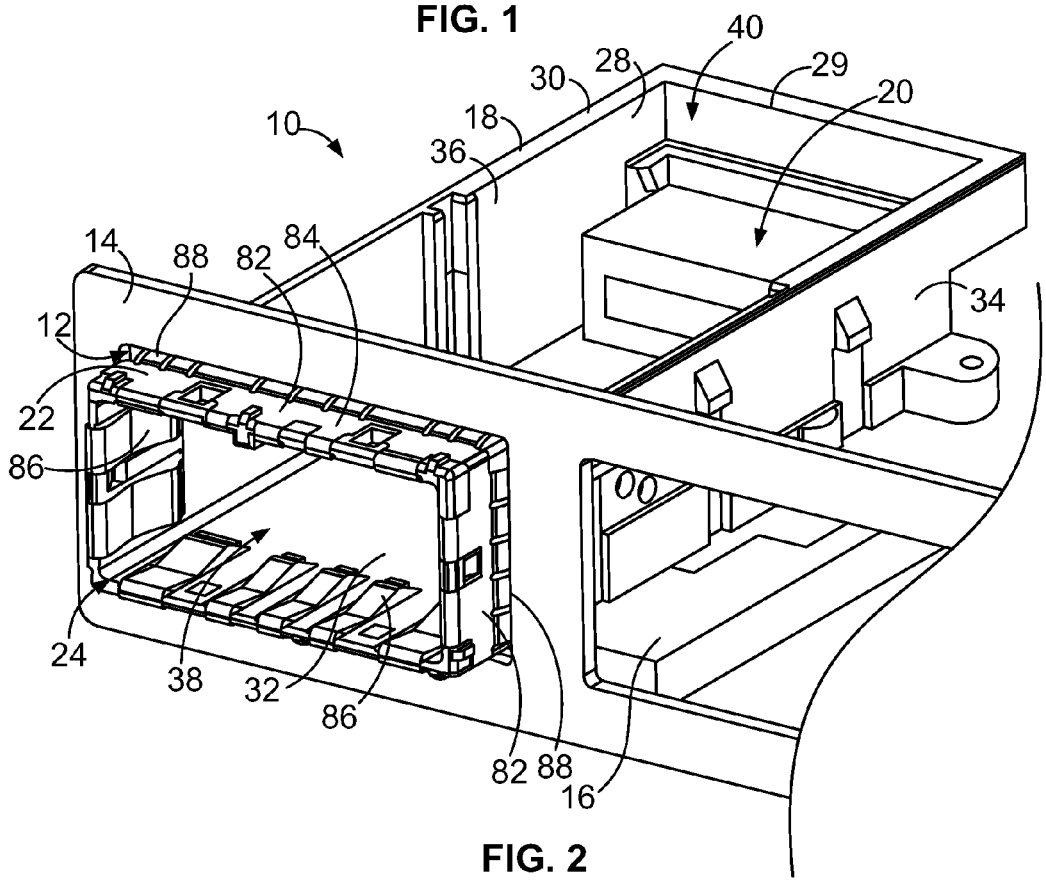
FIG. 2 is a perspective view of the electrical connector assembly mounted in an opening in a bezel and mounted on a circuit board.

FIG. 1 is a perspective view of an exemplary embodiment of an electrical connector assembly 10. FIG. 2 is a perspective view of the electrical connector assembly 10 mounted in an opening 12 in a panel or bezel 14 and mounted on a circuit board 16. The electrical connector assembly 10 may pass through the opening 12 in the bezel 14. The electrical connector assembly 10 is configured to be positioned on the circuit board 16 for electrically connecting one or more pluggable modules 26 (shown in FIGS. 4 and 5), such as, but not limited to, small form-factor pluggable (SFP) modules, to the circuit board 16 via a communication connector(s) 20. The bezel 14 may be provided at a front of a panel, chassis, housing or other structure in which the electrical connector assembly 10 is utilized. The circuit board 16 is provided interior of such housing and the electrical connector assembly 10 enables one or more pluggable module(s) 26 located outside the housing to be electrically connected to the circuit board 16 contained within the housing.

The electrical connector assembly 10 includes a shielded cage member 18 having one or more communication connectors 20 positioned therein. An EMI gasket 22 is mounted externally on a front end 24 of the cage member 18. The EMI gasket 22 is mechanically and electrically connected to the cage member 18 and to the bezel 14 to reduce electromagnetic interference (EMI) emissions through the opening 12. For example, the EMI gasket 22 may be clipped to the front end 24. The EMI gasket 22 may be attached to the front end 24 by other processes in other embodiments. In some embodiments, the EMI gasket 22 may be integral with the cage member 18.

FIG. 1 illustrates the electrical connector assembly 10 without the communication connector 20, while FIG. 2 illustrates the communication connector 10 being held within the cage member 18. A thermal component (not shown), such as a heat sink, may be positioned within the opening in the top of the cage member 18 for transferring heat from components received in the cage member 18.

During assembly, the bezel 14 is mounted to the panel, chassis and/or the cage member 18. The bezel 14 is mounted over the front end 24. Optionally, a plurality of electrical connector assemblies 10 may be provided in one or more rows and the bezel 14 may include multiple openings 12 for the plurality of electrical connector assemblies 10. The front end 24 passes at least partially through the opening 12 such that the EMI gasket 22 is aligned with and received within the opening 12. The EMI gasket engages the edges of the bezel 14 defining the opening 12. The bezel 14 is manufactured from a conductive material, such as a metal material, and provides electrical shielding for the electrical connector assembly 10. The EMI gasket 22 is electrically connected to the bezel 14 and blocks EMI emissions through the opening 12.

The cage member 18 may be a shielded, die cast cage member that includes a plurality of shielded walls 28 extending from the front end 24 to an opposite rear end 29. In other embodiments, the cage member 102 is a shielded, stamped and formed cage member. In the exemplary embodiments, the cage member 18 has a generally rectangular cross section, and includes an upper wall 30, a lower wall 32, and side walls 34 and 36. However, the cage member 18 may include any suitable cross-sectional shape that enables the cage member 18 to function as described and/or illustrated herein. The cage member 18 includes an internal compartment defining a port 38. The port 38 is configured to at least partially receive a pluggable module 26 therein through an opening at the front end 24. While a single port 38 is shown in the illustrated embodiment, the cage member may be a stacked cage member having multiple ports in a stacked configuration.

The cage member 18 includes an opening 40 in the upper wall 30 that is configured to receive a heat sink (not shown). The cage member 18 also includes an opening 42 extending through the lower wall 32. The opening 42 is adjacent the rear end 29 of the cage member 18 for at least partially receiving the communication connector 20 in the internal compartment of the cage member 18. The opening 42 within the lower wall 32 of the cage member 18 enables electrical connection between the communication connector 20 and the circuit board 16.

Although the cage member 18 is shown as including only one internal compartment and only one port 38 for electrically connecting one pluggable module 26 to the circuit board 16, the cage member 18 may include any number of internal compartments and ports 38, arranged in any pattern, configuration, arrangement, and/or the like (such as, but not limited to, any number of rows and/or columns), for electrically connecting any number of pluggable modules 26 to the circuit board 16.

Figure 3:
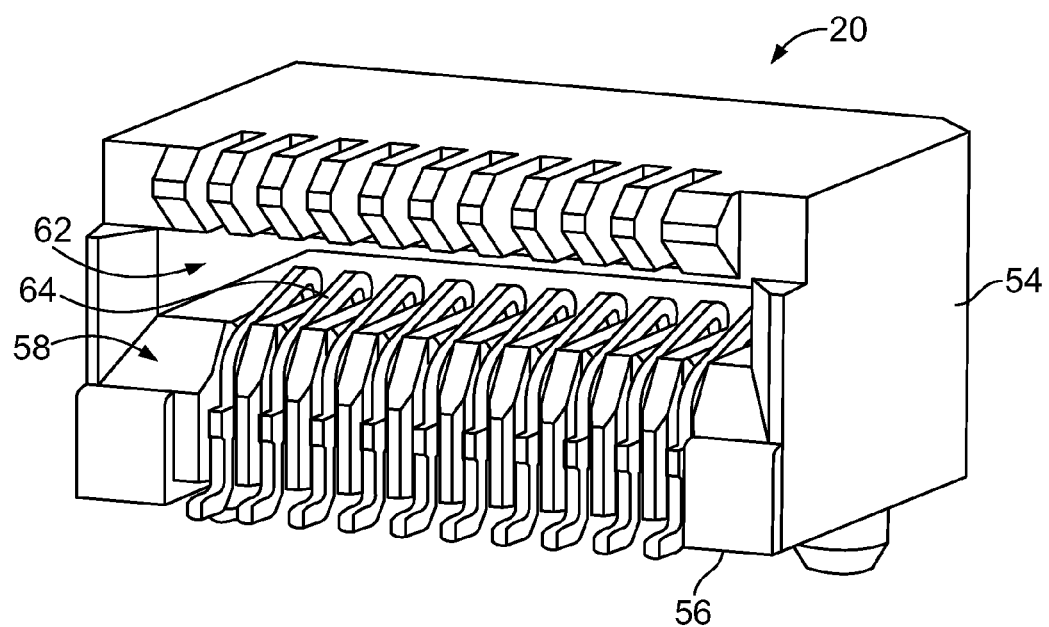
FIG. 3 is a perspective view of an exemplary embodiment of a communication connector of the electrical connector assembly.
Figure 4:
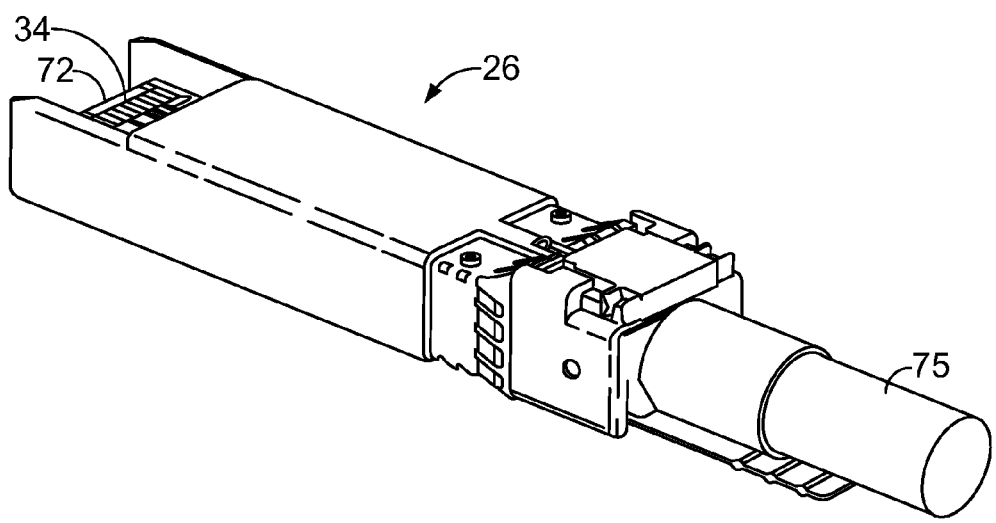
FIG. 4 is a perspective view of an exemplary embodiment of a pluggable module configured to be coupled to the electrical connector assembly.
Figure 5:
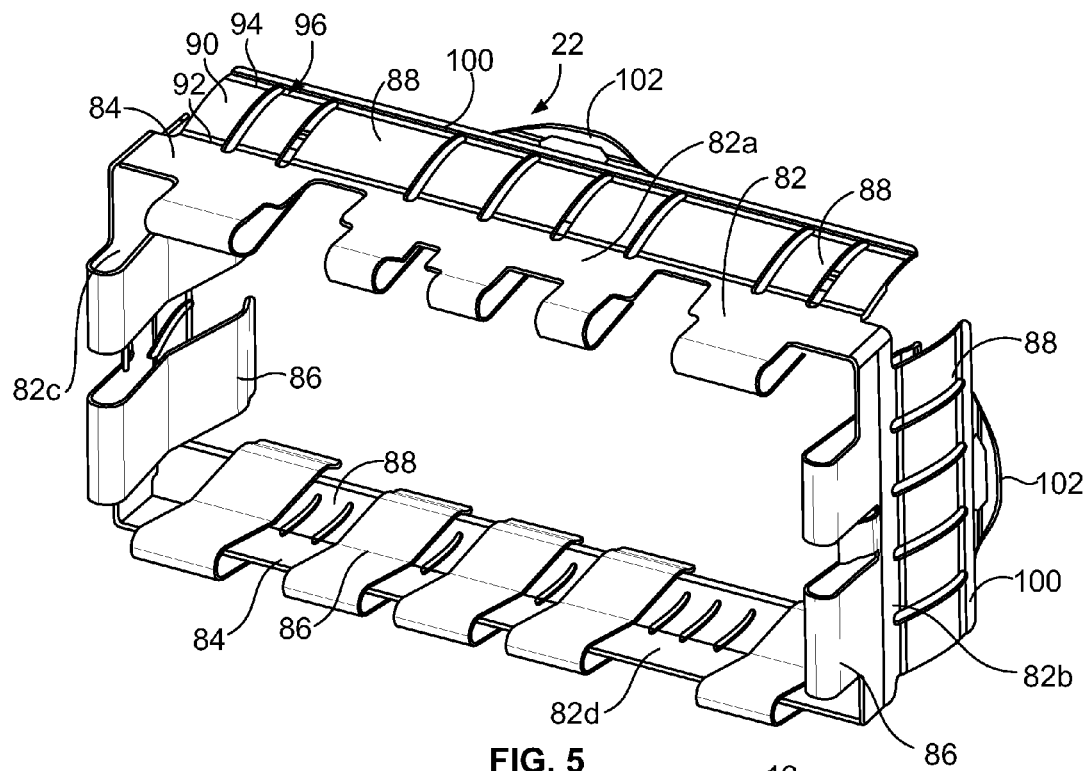
FIG. 5 is a perspective view of an exemplary embodiment of an EMI gasket of the electrical connector assembly.

FIG. 3 is a perspective view of an exemplary embodiment of the communication connector 20 of the electrical connector assembly 10. The communication connector 20 includes a housing 54 having a lower face 56 for mating with the circuit board 16 (FIG. 2) and a mating face 58 for reception of a plug portion of the pluggable module 26 (FIGS. 4 and 5). The mating face 58 includes a terminal receptacle 62 that receives a portion of the pluggable module 26 therein. The housing 54 holds electrical contacts 64 that extend into the terminal receptacle 62. The electrical contacts 64 may each be any suitable type of electrical contact.

FIG. 4 is a perspective view of an exemplary embodiment of the pluggable module 26. Although illustrated as a small form-factor pluggable (SFP) module, the pluggable module 26 may be any suitable type of electrical connector, such as a transceiver. The pluggable module 26 includes a circuit board 72 that is received within the terminal receptacle 62 (shown in FIG. 3) such that electrical contacts 74 on the circuit board 72 are electrically connected to the corresponding electrical contacts 64 (shown in FIG. 3) of the communication connector 20. The electrical contacts 74 may each be any suitable type of electrical contact.

In the exemplary embodiment, the pluggable module 26 is electrically connected to a cable 75. Alternatively, the pluggable module 26 includes an interface (not shown) for electrical connection to another component, such as, but not limited to, a modular jack (not shown), a fiber optic connector and/or the like.

FIG. 5 is a perspective view of an exemplary embodiment of the EMI gasket 22. The EMI gasket 22 includes a stamped and formed body having a one or more body sections 82. In the illustrated embodiment, the EMI gasket 22 includes four body sections 82a, 82b, and 82c, 82d (e.g., a top section, two side sections and a bottom section); however the EMI gasket 22 may include any number of body sections 82. While the body sections 82a, 82b, 82c are illustrated as being integral as part of a single stamped and formed body with the body section 82d a separate stamped and formed piece, it is possible that any of the body sections 82 are separate and discrete and configured to be independently coupled to the cage member 18 (shown in FIG. 1). It is also possible that all of the body sections 82 are integral as a single piece.

With additional reference back to FIGS. 1 and 2, the EMI gasket 22 is configured to be mounted on the front end 24 (FIG. 1) of the cage member 18 such as by front loading or clipping the EMI gasket 22 onto the front end 24. When the cage member 18 is held within the bezel opening 12 (FIG. 2), each body section 82a, 82b, 82c, 82d is engaged between the bezel 14 (FIG. 2) and a respective one of the walls of the cage member 18. The bottom body section 82d may be electrically connected to the other body sections, such as body sections 82b, 82c, such as by welding.

The body sections 82 may have any suitable configuration, arrangement, and/or the like, and/or may include any suitable structure, means, and/or the like that enables the EMI gasket 22 to function as described and/or illustrated herein. In an exemplary embodiment, each of the body sections 82 includes a plurality of electrically conductive springs that extend from a common electrically conductive base 84. The base 84 is configured to extend along the wall(s) of the cage member 18.

In an exemplary embodiment, the EMI gasket 22 includes internal spring beams 86 that extend forward from the base 84 and are configured to be received interior of the cage member 18. For example, the internal spring beams 86 may wrap around behind the base 84 to form clips to clip the EMI gasket 22 to the cage member 18. The internal spring beams 86 are configured to be electrically connected to the pluggable module 26 when the pluggable module 26 is plugged into the cage member 18. The internal spring beams 86 reduce EMI emission or leakage between the cage member 18 and the pluggable module 26.

In an exemplary embodiment, the EMI gasket 22 includes external spring beams 88 that extend rearward from the base 84 and are configured to be located exterior of the cage member 18. The external spring beams 88 are configured to be electrically connected to the bezel 14 when the bezel 14 is coupled to the front end 24 of the cage member 18. The external spring beams 88 reduce EMI emission or leakage between the cage member 18 and the bezel 14. Each of the body sections 82 may include any number of external spring beams 88. For example, in the illustrated embodiment, each of the body sections 82b and 82c includes five external spring beams 88, while the body section 82a includes nine external spring beams 88. The external spring beams 88 may have different widths.

When mounted on the cage member 18, the base 84 of each of the body sections 82a, 82b, 82c, and 82d engages the respective wall 30, 32, 34, and 36 of the cage member 18 to provide an electrical connection between the base 84 and the cage member 18. Each base 84 of each section 82a, 82b, 82c, and 82d may be mounted on the cage member 18 using any suitable configuration, arrangement, method, structure, means, and/or the like, such as, but not limited to, clipping, fastening, using adhesive, frictional and/or stictional engagement, welding, one or more latching mechanisms, mechanical fasteners, and/or the like.

When the EMI gasket 22 is mounted on the cage member front end 24, the body sections 82 surround at least a portion of the cage member front end 24. Although shown as generally completely surrounding the cage member front end 24 in exemplary embodiments, the EMI gasket 22 may alternatively surround only a portion of the cage member front end 24. When the cage member front end 24 is mounted in the opening 12, the external spring beams 88 of the EMI gasket 22 engage the surfaces of the bezel 14 defining the bezel opening 12, thereby electrically connecting the EMI gasket 22 to the bezel 14. The electrical connection between the external spring beams 88 and the bezel 14 facilitates containing electromagnetic interference (EMI) emissions by providing a plurality of contact points that ground the cage member 18 to the bezel 14. The engagement between the external spring beams 88 and the bezel 14 also facilitates securely holding the cage member front end 24 within the opening 12. For example, as the cage member front end 24 is received within the opening 12, the surfaces of the bezel 14 deflect and/or deform the external spring beams 88 generally radially inwardly against their bias, which exerts a spring force on the bezel 14 to securely hold the cage member front end 24 within the opening 12. A size, shape, material, and/or the like of the external spring beams 88 may be selected to provide a predetermined spring force.

The individual external spring beams 88 may be integrally formed with the base 84, or may be fabricated separately from the base 84 and thereafter connected thereto using any suitable method, structure, means, and/or the like, such as, but not limited to, welding, adhesives, mechanical fasteners, and/or the like. The external spring beams 88 each include a body 90 extending between a base end 92 (at the base 84) and a distal end 94 opposite the base end 92. In an exemplary embodiment, the body 90 is outwardly curved to provide a curved mating surface for mating with the bezel 14. The external spring beams 88 may be angled outward, such as at an oblique angle, relative to the base 84. The external spring beams 88 are separated by slots 96 such that the external spring beams 88 are independently movable. In an exemplary embodiment, the distal ends 94 are not free ends, but rather are each connected by a tie bar 100. As such, damage to the external spring beams 88 is reduced as the distal ends 94 are not able to be caught or snagged on components, such as during shipping or loading of the bezel 14 onto the cage member 18.

The tie bar 100 spans across multiple external spring beams 88 to couple the external spring beams 88 together. Optionally, the tie bar 100 may span across each of the external spring beams 88 associated with the corresponding body section 82. For example, one tie bar 100 may span across the top and different tie bars 100 may span along the sides and/or bottom. The tie bars 100 may span substantially the entire widths of the body sections 82, such as between the outermost external spring beams 88 associated with such body section 82. The tie bar 100 may be integrally formed with the external spring beams 88, or may be fabricated separately from the external spring beams 88 and thereafter connected thereto using any suitable method, structure, means, and/or the like, such as, but not limited to, welding, adhesives, mechanical fasteners, and/or the like. Optionally, the external spring beams 88 and/or the tie bar 100 may be flared outwardly. The flared end defined by the external spring beams 88 and/or the tie bar 100 reduces stubbing when the EMI gasket 22 is loaded onto the cage member 18.

In an exemplary embodiment, the EMI gasket 22 includes one or more flanges 102 used as stop surfaces for loading the bezel 14 onto the cage member 18. The flanges 102 ensure that the bezel 14 is not pressed or loaded too far onto the cage member 18, such as beyond the distal ends 94 of the external spring beams 88 and/or the tie bar 100. In the illustrated embodiment, the flanges 102 extend from the tie bars 100. For example, the flanges 102 may extend outward from the tie bars 100 approximately perpendicular to the external spring beams 88. The flanges 102 may be integrally formed with the tie bars 100, or may be fabricated separately from the tie bars 100 and thereafter connected thereto using any suitable method, structure, means, and/or the like, such as, but not limited to, welding, adhesives, mechanical fasteners, and/or the like. Each tie bar 100 may have any number of flanges 102 extending therefrom. Optionally, the flanges 102 may span approximately the entire widths of the tie bars 100. Alternatively, the flanges 102 may be narrower than the tie bars 100.

Figure 6:
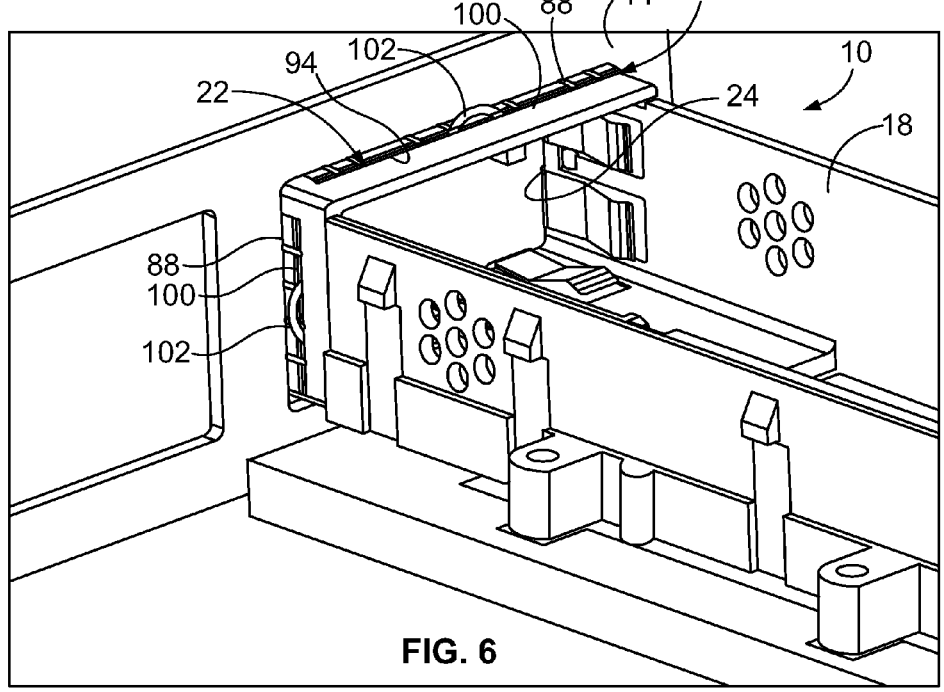
FIG. 6 is a rear perspective view of the electrical connector assembly mounted in an opening in the bezel.

FIG. 6 is a rear perspective view of the electrical connector assembly 10 mounted in the opening 12 in the bezel 14. The EMI gasket 22 is shown coupled to the front end 24 of the cage member 18. The external spring beams 88 extend along the exterior of the walls of the cage member 18. When the bezel 14 is coupled to the front end 24 of the cage member 18, the front end 24 and the EMI gasket 22 passes through the opening 12. Preferably, the bezel 14 is loaded into position until the bezel encounters a positive stop. For example, the housing or chassis of the structure or device housing the electrical connector assembly 10 may limit or stop loading of the bezel 14 onto the cage member 18.

However, in some embodiments, depending on how the electrical connector assembly 10 is held in such housing or chassis, the bezel 14 may not engage such housing or chassis. To prevent overloading of the bezel 14 onto the cage member 18 (for example, pressing the bezel 14 to far rearward), the EMI gasket 22 provides the flanges 102 to stop the bezel 14. When the bezel 14 engages the flanges 102, the bezel is unable to be further loaded. As such, the bezel 14 cannot be pushed past or beyond the distal ends 94 of the external spring beams 88 and/or the tie bars 100. If such were to occur, the external spring beams 88 would be damaged when the bezel 14 is attempted to be removed. The flanges 102 protect the external spring beams 88 from damage.

The embodiments described and illustrated herein provide an electrical connector assembly for pluggable modules that reduces leakage of EMI emissions through the bezel. The embodiments described and illustrated herein provide an electrical connector assembly for pluggable modules that prevent damaging the external spring beams of the EMI gasket by preventing overloading of the bezel onto the cage member.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. An EMI gasket for a cage member of an electrical connector assembly, the EMI gasket comprising:
    a base having a metal body section configured to extend along a wall of the cage member;
    external spring beams extending from the base, the external spring beams being configured to be received in an opening of a bezel mounted to a front end of the cage member and configured to engage the bezel to electrically connect the EMI gasket to the bezel, the external spring beams extend from base ends at the base to distal ends opposite the base ends; and
    a tie bar at the distal ends connecting the distal ends of the external spring beams together, the tie bar having a flange extending outward therefrom, the flange being configured to stop loading of the bezel onto the front end of the cage member.

2. The EMI gasket of claim 1, wherein the external spring beams are separated by slots such that the external spring beams are independently moveable.

3. The EMI gasket of claim 1, wherein the external spring beams are outwardly curved for interference with the bezel.

4. The EMI gasket of claim 1, wherein the tie bar spans across the distal ends of the external spring beams such that the external spring beams do not include free ends.

5. The EMI gasket of claim 1, wherein the tie bar extends substantially an entire width of the body section.

6. The EMI gasket of claim 1, wherein the flange is oriented generally perpendicular to the external spring beams.

7. The EMI gasket of claim 1, wherein the flange engages the bezel to align the external spring beams within the opening of the bezel.

8. The EMI gasket of claim 1, wherein the tie bar includes multiple flanges.

9. The EMI gasket of claim 1, wherein the body section has a width, the external spring beams being spaced along the width, the tie bars spanning substantially the entire width.

10. The EMI gasket of claim 1, wherein the base, the external spring beams and the tie bar are stamped and formed from a stock material.

11. The EMI gasket of claim 1, wherein the base includes a plurality of body sections configured to extend along different walls of the cage member, each body section having corresponding external spring beams extending therefrom.

12. The EMI gasket of claim 1, further comprising internal spring beams extending from the base, the internal spring beams extending interior of the base and configured to be received interior of a port of the cage member for electrical connection with a pluggable module loaded into the port.

13. The EMI gasket of claim 12, wherein the internal spring beams extend from a front of the base and wrap behind the base such that the internal spring beams are aligned with the external spring beams with the wall of the cage member therebetween.

14. An electrical connector assembly comprising:
    a cage member having a plurality of walls defining a port configured to receive a pluggable module therein through a front end of the cage member, the walls being manufactured from a metal material and providing electrical shielding for the port; and
    an EMI gasket mounted to the front end of the cage member, the EMI gasket comprising a base coupled to at least one of the walls of the cage member and being electrically connected to the cage member, the EMI gasket having external spring beams extending from the base and being configured to be received in an opening of a bezel mounted to the front end of the cage member, the EMI gasket having a tie bar connecting distal ends of the external spring beams together, the tie bar having a flange extending outward therefrom, the flange being configured to stop loading of the bezel onto the front end of the cage member.

15. The electrical connector assembly of 14, wherein the external spring beams are separated by slots such that the external spring beams are independently moveable.

16. The electrical connector assembly of 14, wherein the external spring beams are outwardly curved for interference with the bezel.

17. The electrical connector assembly of 14, wherein the tie bar spans across the distal ends of the external spring beams such that the external spring beams do not include free ends.

18. The electrical connector assembly of 14, wherein the tie bar extends substantially an entire width of the body section.

19. The electrical connector assembly of 14, wherein the flange is oriented generally perpendicular to the external spring beams.

20. An electrical connector assembly comprising:
    a cage member having a plurality of walls defining a port configured to receive a pluggable module, the walls being manufactured from a metal material and providing electrical shielding for the port;
    a communication connector disposed within the cage member at a rear end of the cage member and positioned to mate with the pluggable module when the pluggable module is inserted into the port;
    an EMI gasket mounted to the front end of the cage member, the EMI gasket comprising a base coupled to at least one of the walls of the cage member and being electrically connected to the cage member, the EMI gasket having internal spring beams extending from the base into the port of the cage member for electrical connection with the pluggable module, the EMI gasket having external spring beams extending from the base, the EMI gasket having a tie bar connecting distal ends of the external spring beams together, the tie bar having a flange extending outward therefrom; and a bezel mounted to the front end of the cage member, the bezel having an opening surrounding the front end of the cage member and the EMI gasket, the bezel having a rear, wherein the external spring beams engage the bezel in the opening, the rear abutting against the flange to stop loading of the bezel onto the front end of the cage member.

\* \* \* \* \*